United States Patent
Arai et al.

(10) Patent No.: US 10,892,030 B2
(45) Date of Patent: Jan. 12, 2021

(54) MEMORY SYSTEM WITH CONTROLLER AND MEMORY CHIPS, WHERE CONTROLLER CAN CHANGE A SET VALUE READ LEVEL AND INSTRUCT MEMORY CHIP TO EXECUTE READ OPERATION WITH THE CHANGED SET VALUE

(71) Applicant: TOSHIBA MEMORY CORPORATION, Minato-ku (JP)

(72) Inventors: Kenichi Arai, Yokohama (JP); Yoshikazu Harada, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/564,513

(22) Filed: Sep. 9, 2019

(65) Prior Publication Data

US 2020/0227132 A1    Jul. 16, 2020

(30) Foreign Application Priority Data

Jan. 10, 2019   (JP) .................................. 2019-002873

(51) Int. Cl.

| G11C 29/50 | (2006.01) |
|---|---|
| G01R 31/28 | (2006.01) |
| G11C 29/06 | (2006.01) |
| G11C 29/44 | (2006.01) |
| G06F 11/07 | (2006.01) |
| G11C 16/26 | (2006.01) |
| G11C 16/24 | (2006.01) |
| H03M 13/11 | (2006.01) |

(Continued)

(52) U.S. Cl.
CPC .... *G11C 29/50004* (2013.01); *G01R 31/2879* (2013.01); *G06F 11/07* (2013.01); *G06F 11/073* (2013.01); *G11C 16/08* (2013.01); *G11C 16/24* (2013.01); *G11C 16/26* (2013.01); *G11C 29/06* (2013.01); *G11C 29/44* (2013.01); *H03M 13/11* (2013.01); *G11C 29/32* (2013.01); *G11C 2029/4402* (2013.01); *G11C 2029/5004* (2013.01)

(58) Field of Classification Search
CPC ...... G11C 29/50004; G11C 2029/5004; G01R 31/2879
See application file for complete search history.

(56) References Cited

U.S. PATENT DOCUMENTS

| 8,411,502 B2 | 4/2013 | Yoon et al. |
| 9,076,534 B2 | 7/2015 | Yoon et al. |
| 9,406,394 B2 | 8/2016 | Yoon et al. |

(Continued)

FOREIGN PATENT DOCUMENTS

| JP | 2003-196999 A | 7/2003 |
| JP | 2004-14037 A | 1/2004 |

(Continued)

*Primary Examiner* — Mushfique Siddique
(74) *Attorney, Agent, or Firm* — Oblon, McClelland, Maier & Neustadt, L.L.P.

(57) ABSTRACT

According to one embodiment, a memory chip includes a memory cell array and first circuitry. The first circuitry executes a first operation of reading data from a target area of the memory cell array, using a parameter. After the first operation, the first circuitry executes a second operation of changing a set value of the parameter to read the data.

10 Claims, 9 Drawing Sheets

(51) Int. Cl.
　　　*G11C 16/08*　　　(2006.01)
　　　*G11C 29/32*　　　(2006.01)

(56)　　　　　　References Cited

U.S. PATENT DOCUMENTS

| | | | |
|---|---|---|---|
| 2007/0234143 | A1 | 10/2007 | Kim |
| 2008/0263262 | A1* | 10/2008 | Sokolov ................. G11C 16/20 |
| | | | 711/100 |
| 2011/0194346 | A1 | 8/2011 | Yoon et al. |
| 2013/0208541 | A1 | 8/2013 | Yoon et al. |
| 2013/0238836 | A1* | 9/2013 | Suzuki ............... G11C 16/3495 |
| | | | 711/103 |
| 2014/0281769 | A1* | 9/2014 | Ohshima ................ G11C 29/42 |
| | | | 714/721 |
| 2015/0262700 | A1 | 9/2015 | Yoon et al. |
| 2016/0071607 | A1* | 3/2016 | Kanno ................. H03M 13/611 |
| | | | 714/760 |
| 2016/0239381 | A1* | 8/2016 | Nakazumi ........... G06F 11/1072 |
| 2017/0115904 | A1* | 4/2017 | Hashimoto ........... G06F 11/004 |
| 2018/0076829 | A1* | 3/2018 | Ueki ...................... G11C 16/10 |
| 2018/0261290 | A1* | 9/2018 | Uehara ............... G11C 11/5642 |
| 2019/0267100 | A1* | 8/2019 | Pan ........................ G11C 16/26 |
| 2020/0026346 | A1* | 1/2020 | Nosaka ................. G06F 9/5027 |
| 2020/0285418 | A1* | 9/2020 | Hara .................. G11C 16/0483 |

FOREIGN PATENT DOCUMENTS

| | | |
|---|---|---|
| JP | 2012-69185 A | 4/2012 |
| TW | 1484493 B | 5/2015 |

\* cited by examiner

MEMORY SYSTEM WITH CONTROLLER AND MEMORY CHIPS, WHERE CONTROLLER CAN CHANGE A SET VALUE READ LEVEL AND INSTRUCT MEMORY CHIP TO EXECUTE READ OPERATION WITH THE CHANGED SET VALUE

CROSS-REFERENCE TO RELATED APPLICATIONS

This application is based upon and claims the benefit of priority from Japanese Patent Application No. 2019-002873, filed on Jan. 10, 2019; the entire contents of which are incorporated herein by reference.

FIELD

Embodiments described herein relate generally to a memory chip.

BACKGROUND

Conventionally, memory chips of NAND flash memories are subjected to a test before shipping. Furthermore, memory chips in which a set value of a read level is changeable are known. To test memory chip changeable in a set value of a read level, a test device is prepared to detect a fail bit in data read from the memory chip or transmit an instruction for changing the read level of the memory chip in accordance with a result of the fail bit detection. That is, such a test device is required to be able to verify a response from the memory chip so that it is expensive. In addition, the verification of the response from the memory chip will increase the time taken for conducting the test.

DETAILED DESCRIPTION

According to an embodiment, in general, a memory chip includes a memory cell array and a first circuitry. The first circuitry executes a first operation of reading data from a target area of the memory cell array, using a parameter. After the first operation, the first circuitry executes a second operation of changing a set value of the parameter to read the data.

Hereinafter, the memory chip according to the embodiment will be described in detail with reference to the accompanying drawings. The following embodiment is merely exemplary and not intended to limit the scope of the present invention The memory chip of the embodiment and a memory controller can constitute a memory system.

Figure 1:
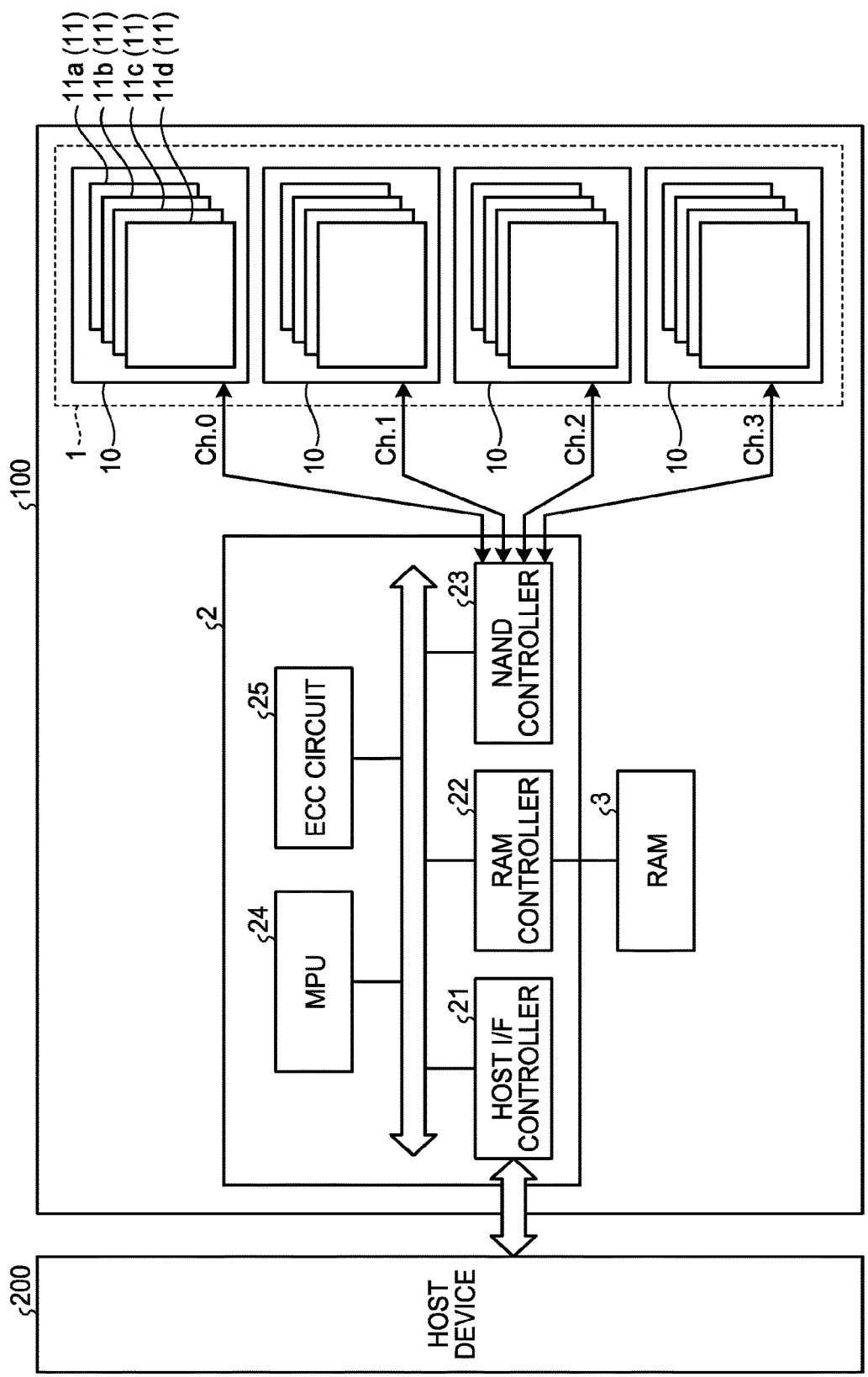
FIG. 1 is a schematic diagram illustrating an exemplary use of a memory chip according to an embodiment.

FIG. 1 schematically illustrates the memory chip mounted on the memory system in the embodiment by way of example. Herein, the memory system is exemplified by a solid state drive (SSD). The memory chip of the embodiment can be mounted on a memory system other than the SSD.

As illustrated in FIG. 1, an SSD 100 is connected to a host device 200 such as a personal computer and functions as an external storage device in the host device 200. Examples of standard to which a communication interface connecting the SSD 100 and the host device 200 conforms include serial advanced technology attachment (SATA), serial attached SCSI (SAS), and PCI express (PCIe).

The SSD 100 includes a NAND memory 1; a memory controller 2 that transfers data between the host device 200 and the NAND memory 1; and a RAM 3 being a volatile memory in which the memory controller 2 temporarily stores transfer data. Data transmitted from the host device 200 is temporarily stored in the RAM 3 under the control of the memory controller 2, and read from the RAM 3 and written to the NAND memory 1.

The NAND memory 1 includes a plurality of (herein, four) multi-chip packages 10. The four multi-chip packages 10 are connected to the memory controller 2 through wiring of different channels (Ch. 0 to Ch. 3). The multi-chip packages for the respective channels are controlled independently of each other. That is, the four multi-chip packages 10 are connected to the memory controller 2 so as to be concurrently operable.

Each of the channels includes an I/O signal line, a control signal line, and an R/B signal line. Hereinafter, the "signal line" may be abbreviated as a "signal". Control signals include a chip enable signal (CE), a command latch enable signal (CLE), an address latch enable signal (ALE), a write enable signal (WE), a read enable signal (RE), a write protect signal (WP), and a data strobe signal (DQS).

Each of the multi-chip packages 10 includes a plurality of (herein, four) memory chips 11a to 11d sealed with a mold resin. The I/O signal line, the control signal line, and the R/B signal line are commonly connected to the four memory chips 11a to 11d in a single multi-chip package 10. Part or all of wiring groups constituting the channel may not be commonly connected to the four memory chips 11a to 11d.

The memory chips 11a to 11d in each of the multi-chip packages 10 are an exemplary memory chip of the embodiment. The memory chips 11a to 11d may be collectively referred to as a memory chip 11.

The memory controller 2 includes a host interface (I/F) controller 21, a RAM controller 22, a NAND controller 23, an MPU 24, and an error check and correct (ECC) circuit 25. The host I/F controller 21 controls the communication interface with the host device 200 and controls data transfer between the host device 200 and the RAM 3. The RAM controller 22 controls data read operation and write operation with respect to the RAM 3. The ECC circuit 25 can correct error in the data read from the memory chip 11, that is, a fail bit.

The MPU 24 controls the entire memory controller 2 by a computer program such as firmware. The MPU 24 can manage a correspondence between a logical address and a physical address, perform garbage collection, refresh operation, and wear leveling, and change a set value of a read level, for example. Part or all of the operations to be executed by the MPU 24 may be implemented by hardware circuitry requiring no computer program. The read level will be described later.

The NAND controller 23 controls data transfer between the NAND memory 1 and the RAM 3. The NAND controller 23 transmits an I/O signal and a control signal to the multi-chip package 10 of a desired channel in response to a read command, a write command, or an erase command from the MPU 24. The memory chips 11a to 11d of the multi-chip package 10 of the channel can operate in accordance with the received signal.

The mounting of the memory chip 11 is not limited to the above example. The memory chip 11 may not be enclosed in the multi-chip package 10.

Figure 2:
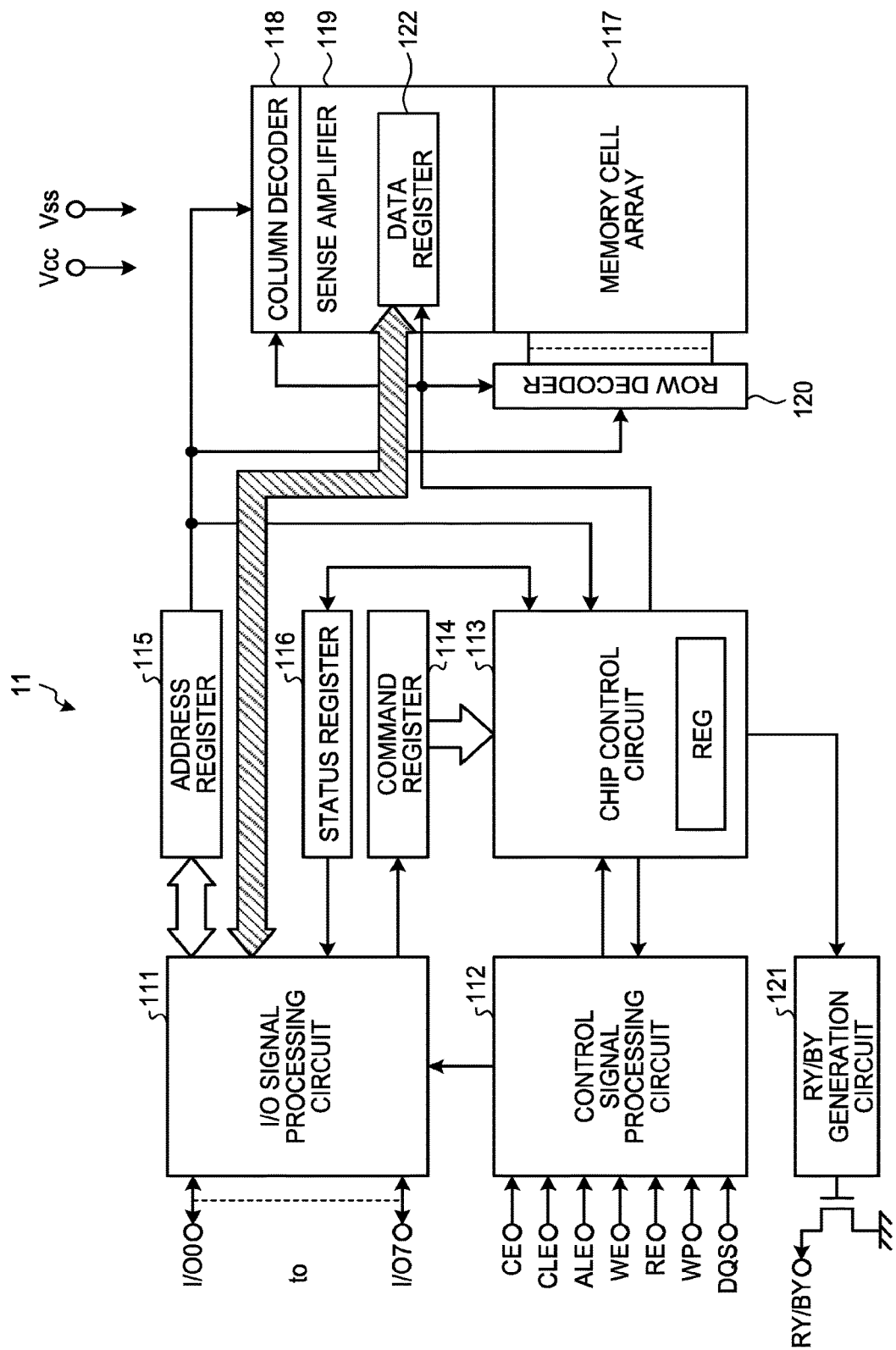
FIG. 2 is a diagram illustrating an exemplary configuration of the memory chip in the embodiment.

FIG. 2 is a diagram illustrating an exemplary configuration of the memory chip 11 in the embodiment. As illustrated in the FIG. 2, the memory chip 11 includes an I/O signal processing circuit 111, a control signal processing circuit 112, a chip control circuit 113, a command register 114, an address register 115, a status register 116, a memory cell array 117, a column decoder 118, a sense amplifier 119, a row decoder 120, and an RY/BY generation circuit 121. The sense amplifier 119 includes a data register 122.

The chip control circuit 113, the sense amplifier 119, and the row decoder 120 are exemplary first circuitry. The I/O signal processing circuit 111, the control signal processing circuit 112, and the RY/BY generation circuit 121 are exemplary second circuitry.

The control signal processing circuit 112 receives the various control signals, and sorts I/O signals received by the I/O signal processing circuit 111 into registers for storage in accordance with the received control signals. The control signal processing circuit 112 transfers the received control signals to the chip control circuit 113.

The chip control circuit 113 represents a state transition circuit, i.e., a state machine that makes a state transition in accordance with the various control signals received via the control signal processing circuit 112. The chip control circuit 113 controls the entire operation of the memory chip 11 in accordance with the various control signals. The chip control circuit 113 can generate status information indicating a state or a result of operation control and store the status information in the status register 116. The chip control circuit 113 can output the status information from the status register 116 via the I/O signal processing circuit 111 in response to a status read command from the memory controller 2, for example.

The chip control circuit 113 includes a register REG. Information to store in the register REG will be described later.

The RY/BY generation circuit 121 causes the RY/BY signal line to transition between a ready state (R) and a busy state (B) under the control of the chip control circuit 113.

The I/O signal processing circuit 111 represents a buffer circuit that transmits and receives the I/O signals to and from the memory controller 2 via the I/O signal line. The I/O signal processing circuit 111 acquires a command, an address, and data (write data) as the I/O signals and sorts them into the address register 115, the command register 114, and the data register 122 for storage, respectively.

The address stored in the address register 115 includes a row address and a column address. The row address and the column address are read to the row decoder 120 and the column decoder 118, respectively.

The memory cell array 117 includes arrayed NAND memory cells, and receives and stores write data from the host device 200. Specifically, the memory cell array 117 includes a plurality of blocks BLK. The entire data stored in a single block BLK is collectively erased.

Figure 3:
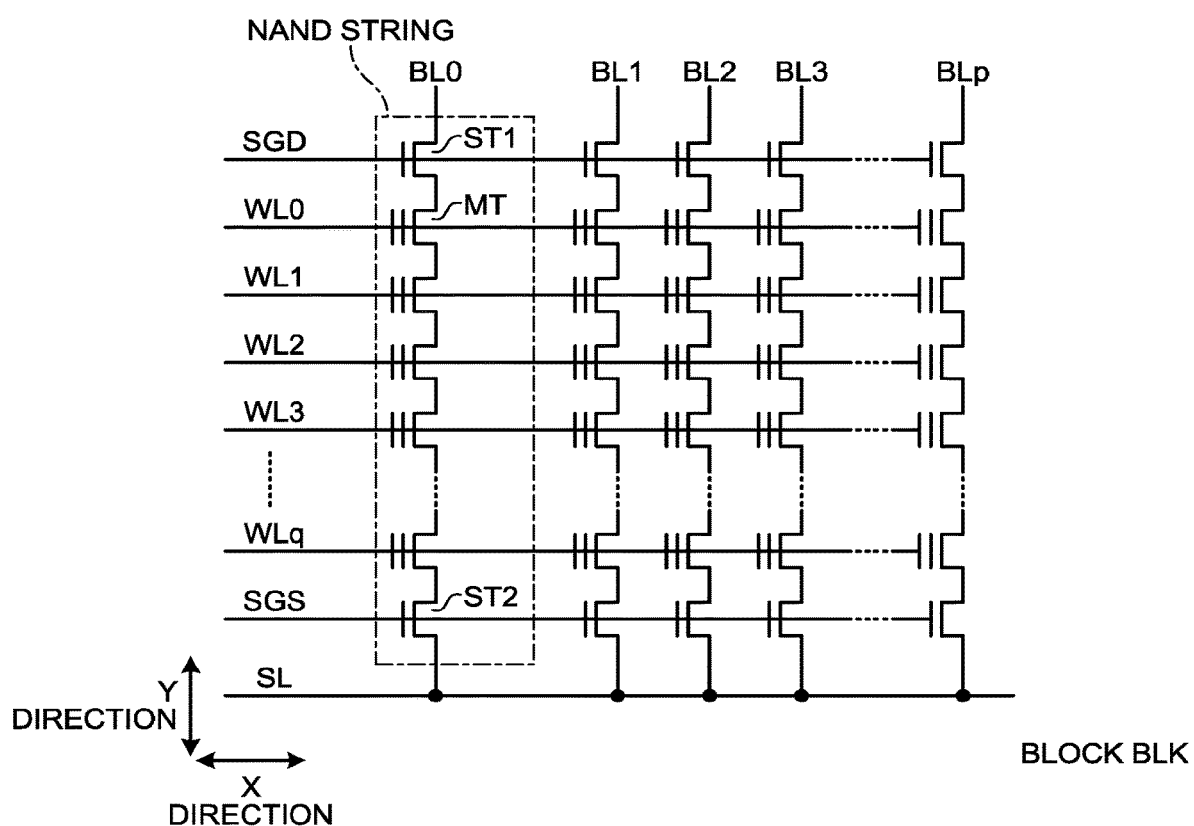
FIG. 3 is a circuit diagram illustrating an exemplary configuration of one block BLK of a memory cell array in the embodiment.

FIG. 3 is a circuit diagram illustrating an exemplary configuration of one block BLK of the memory cell array 117 in the embodiment. As illustrated in FIG. 3, the block BLK includes (p+1) NAND strings arrayed in order in X direction (p≥0). The (p+1) NAND strings each include select transistors ST1 having drains connected to bit lines BL0 to BLp, respectively, and gates commonly connected to a select gate line SGD. Select transistors ST2 have sources commonly connected to a source line SL, and gates commonly connected to a select gate line SGS.

The memory cell transistor MT includes a control gate electrode and a charge storage layer. The memory cell transistor MT is, as one example, a MONOS transistor including an insulating film as the charge storage layer. The threshold voltage of the memory cell transistor MT varies depending on the number of electrons stored in the charge storage layer.

In each NAND string, (q+1) memory cell transistors MT are arranged such that their current paths are connected in series between the source of the select transistor ST1 and the drain of the select transistor ST2 (q≥0). The control gate electrodes are connected to word lines WL0 to WLq in order from the memory cell transistor MT closest to the drain. Thus, the drain of the memory cell transistor MT connected to the word line WL0 is connected to the source of the select transistor ST1, and the source of the memory cell transistor MT connected to the word line WLq is connected to the drain of the select transistor ST2.

Each of the word lines WL0 to WLq connects the control gate electrodes of the memory cell transistors MT in common among all the NAND strings of the block. That is, the control gate electrodes of the memory cell transistors MT in the same row of the block are connected to the same word line WL. Data program operation and data read operation can be performed collectively on (p+1) memory cell transistors MT connected to the same word line WL. In the case of memory cell transistors MT that can hold a 1-bit value, the (p+1) memory cell transistors MT connected to the same word line WL are handled as one page, and data program operation and data read operation are performed on a page basis.

Data program operation to the memory cell array 117 will be referred to as program operation. Data read operation to the memory cell array 117 will be referred to as read operation. Program operation and read operation can be executed on a word-line-WL basis.

In the embodiment, each of the memory cell transistors MT can store multiple-bit values. A method for each memory cell transistors MT to store a 3-bit value will be described as an example. The method for each memory cell transistors MT to store a 3-bit value is known as triple-level cell (TLC). In the following the memory cell transistor MT will be simply referred to as the memory cell.

Figure 4:
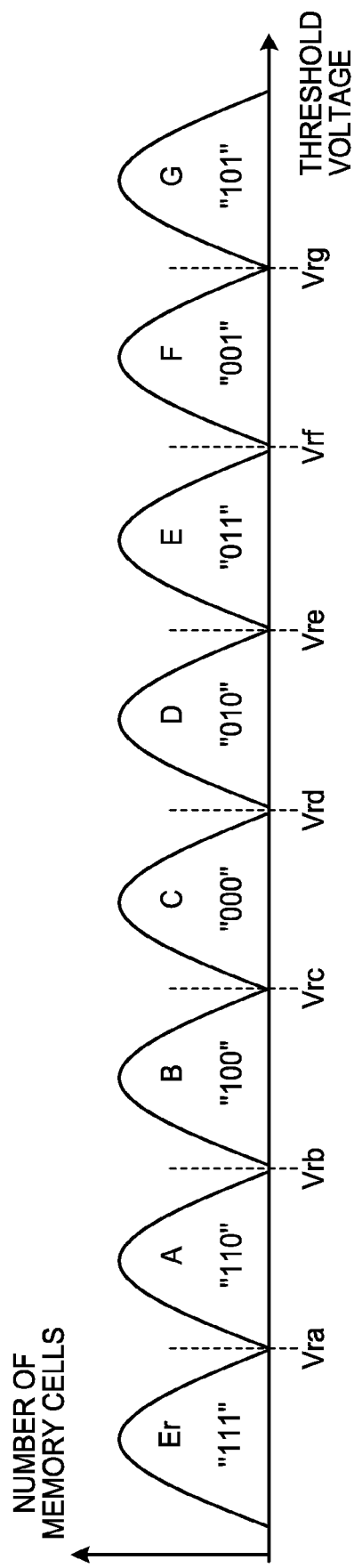
FIG. 4 is a graph illustrating an exemplary possible threshold voltage of a memory cell by TLC in the embodiment.

FIG. 4 is a schematic graph illustrating an exemplary possible threshold voltage of the memory cell by TLC in the embodiment. The vertical axis represents the number of memory cells, and the horizontal axis represents the threshold voltage.

According to TLC, a possible threshold-voltage range is divided into eight ranges. The eight divisions will be referred to as a state Er, a state A, a state B, a state C, a state D, a state E, a state F, and a state G in ascending order of the threshold voltage. The threshold voltage of each memory cell is controlled to be in any of the state Er, the state A, the state B, the state C, the state D, the state E, the state F, and the state G. As a result, in the case of plotting the number of memory cells with respect to the threshold voltage, the memory cells exhibit eight lobes in different states.

The eight states correspond to three bits of data. According to the example of FIG. 4, the state Er corresponds to "111", the state A corresponds to "110", the state B corresponds to "100", the state C corresponds to "000", the state D corresponds to "010", the state E corresponds to "011", the state F corresponds to "001", and the state G corresponds to "101". Thus, each memory cell can hold data according to the state of the threshold voltage. The relationship illustrated in FIG. 4 is exemplary data coding. The data coding is not limited to this example.

Among the 3-bit data held in one memory cell, a least significant bit (LSB) will be referred to as a lower bit, a most significant bit (MSB) will be referred to as an upper bit, and a bit between LSB and MSB will be referred to as a middle bit. A set of lower bits of all memory cells belonging to the same word line WL will be referred to as a lower page. A set of middle bits of all the memory cells connected to the same word line WL will be referred to as a middle page. A set of upper bits of all the memory cells connected to the same word line WL will be referred to as an upper page. The lower page, the middle page, and the upper page will be referred to as page types.

A read level is set at the boundary between every two adjacent states. FIG. 4 depicts a read level Vra set at a boundary between the state Er and the state A, a read level Vrb set at a boundary between the state A and the state B, a read level Vrc set at a boundary between the state B and the state C, a read level Vrd set at a boundary between the state C and the state D, a read level Vre set at a boundary between the state D and the state E, a read level Vrf set at a boundary between the state E and the state F, and a read level Vrg set at a boundary between the state F and the state G, by way of example.

In the read operation, data stored in a memory cell is determined by comparing the threshold voltage of the memory cell concerned and the read level. The read operation will be described in detail later.

Referring back to FIG. 2, the row decoder 120, the column decoder 118, and the sense amplifier 119 access the memory cell array 117 under the control of the chip control circuit 113.

Specifically, in the program operation the row decoder 120 selects and activates a word line corresponding to a row address, and the column decoder 118 selects and activates a bit line corresponding to a column address. The sense amplifier 119 applies a voltage to the bit line selected by the column decoder 118, and writes data from the data register 122 to a target memory cell located at an intersection between the word line selected by the row decoder 120 and the bit line selected by the column decoder 118.

In the read operation, the row decoder 120 sequentially applies read levels to a word line corresponding to a row address, in accordance with the page types. The sense amplifier 119 senses a conductive state or a non-conductive state of the target memory cell upon application of each read level to the word line by the row decoder 120, determines data stored in the target memory cell according to a sensing result corresponding to each read level, and stores the determined data in the data register 122. The data is sent from the data register 122 to the I/O signal processing circuit 111 through a data line and transferred from the I/O signal processing circuit 111 to the memory controller 2.

Figure 5:
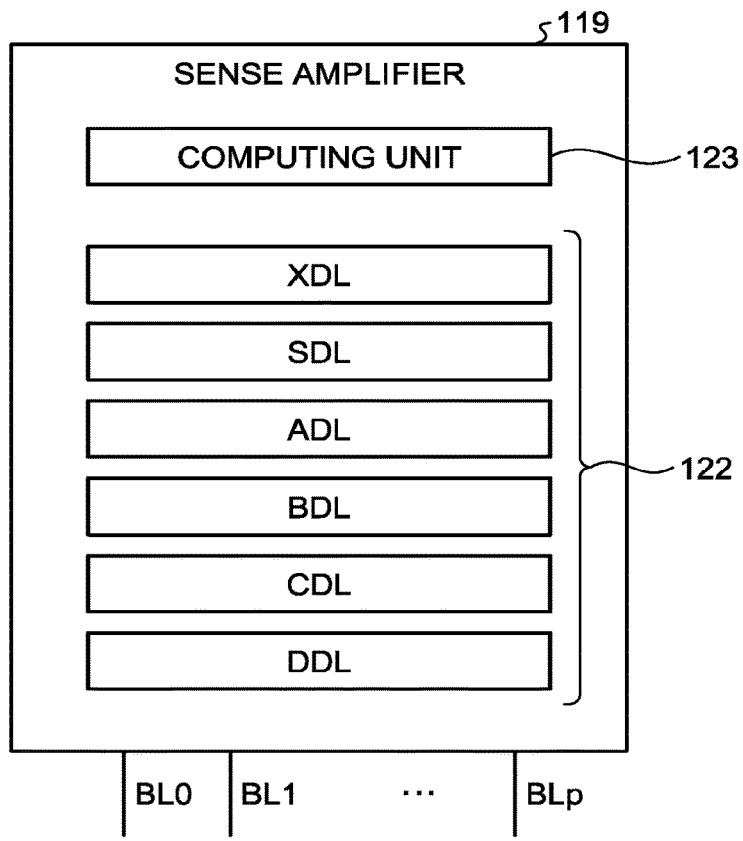
FIG. 5 is a schematic diagram illustrating an exemplary configuration of a sense amplifier in the embodiment.

FIG. 5 is a schematic diagram illustrating an exemplary configuration of the sense amplifier 119 in the embodiment. As illustrated in FIG. 5, the sense amplifier 119 includes the data register 122 and a computing unit 123. The data register 122 includes six latch circuit groups SDL, ADL, BDL, CDL, DDL, and XDL.

The six latch circuit groups are, for example, provided for the bit lines BL, respectively. That is, each of the six latch circuit groups can store data of one page. The computing unit 123 can execute, a bitwise operation on data stored in the latch circuit groups between the latch circuits corresponding to the same bit line BL.

In the read operation, for example, upon application of a read level, the sense amplifier 119 senses a conductive state or a non-conductive state of a target memory cell and sequentially stores sensing results in one of the six latch circuit groups, for example, the group SDL. The computing unit 123 performs a bitwise operation on the sensing results corresponding to the read levels sequentially stored in SDL while utilizing the latch circuit groups ADL, BDL, CDL, DDL, and XDL as storage areas of intermediate data. The computing unit 123 generates a conclusive result of the operation, that is, data corresponding to a state of the threshold voltage, and stores the data in the latch circuit group XDL. The data is sent from the latch circuit group XDL to the I/O signal processing circuit 111 through the data line.

A method of the bitwise operation is not limited to a particular method. The following briefly describes an exemplary bitwise operation for determining data stored in the lower page. As the sensing result, "0" represents the conductive state, and "1" represents the non-conductive state.

According to the data coding illustrated in FIG. 4, in the four states from the read level Vra to the read level Vre, lower-bit data corresponds to "0". In the other four states, lower-bit data corresponds to "1". That is, to read data of a lower page, the read level Vra and the read level Vre are applied.

The sense amplifier 119 first stores, in the latch circuit group SDL, a sensing result AR obtained by application of the read level Vra, and after a while, stores a sensing result ER obtained by application of the read level Vre. The computing unit 123 first performs a negative (NOT) operation on the sensing result AR stored in the latch circuit group SDL, and stores the sensing result AR inverted by a NOT operation in another latch circuit group (for example, DDL). After storing the sensing result ER in the latch circuit group SDL, the computing unit 123 performs a logical OR operation of the inverted sensing result AR stored in the latch circuit group DDL and the sensing result ER stored in the latch circuit group SDL, and stores a result of the OR operation in the latch circuit group XDL.

Through the series of bitwise operation, "0" is read from the memory cells whose threshold voltages are in the range from the read level Vra to the read level Vre, and "1" is read from the memory cells whose threshold voltages are outside the range from the read level Vra to the read level Vre.

The method of the bitwise operation is not limited to the method described above. The data stored in the lower page can be determined by any bitwise operation.

To determine data stored in the middle page and the lower page, a given bitwise operation corresponding to a page type is executed. A description of a method of the bitwise operation for determining the data stored in the middle page and the lower page is omitted.

The number of the latch circuit groups of the sense amplifier 119 is not limited to six. The number of the latch circuit groups of the sense amplifier 119 can be variously changed depending on a method of a bitwise operation. In addition, a usage method of the latch circuit groups in the bitwise operation is not limited to the method described above. The sense amplifier 119 can use its latch circuit groups in any manner.

Meanwhile, the threshold voltage of the memory cell may vary due to various factors. Thus, the data determined by the sense amplifier 119 may differ from the one at the time of the program operation. A different bit between the data at the time of the program operation and the data read by the read operation is referred to as a fail bit. That is, the data read from the memory cell array 117 may contain a fail bit.

The memory controller 2 instructs the memory chip 11 to read data, and upon receiving data in response to the instruction, controls the ECC circuit 25 to detect and correct fail bits in the data. However, the ECC circuit 25 may fail in correcting the fail bits if the number of the fail bits contained in the data exceeds its correctable number. In such a case, the memory controller 2 can change a set value of the read level and instruct the memory chip 11 to execute a read operation with the changed set value.

The read operation executed with a changed set value may be referred to as retry read (RR) operation. For example, the memory controller 2 can cause the memory chip 11 to repeatedly execute the retry read operation while varying the set value of the read level until the ECC circuit 25 successfully corrects the fail bits.

The memory chip 11 configured as described above is subjected to a quality evaluation test before shipment.

According to a comparative technique with the present embodiment, to test a memory chip changeable in the set value of a read level, a test device is prepared to detect a fail bit in data read from the memory chip or transmit an instruction for changing the read level of the memory chip in accordance with a result of the fail bit detection. That is, such a test device is required to be able to verify a response from the memory chip so that it is expensive. In addition, the verification of the response from the memory chip will elongate the time taken for conducting the test.

To the contrary, the memory chip 11 according to the embodiment can automatically execute the retry read operation including the change of the read level. This eliminates the necessity for the test device to verify individual items of data sent from the memory chip 11 or set the read level to the individual memory chips 11 according to a result of data verification. That is, the test can be simplified. Further, the test can be conducted by an inexpensive test device incapable of verifying a response from the memory chip.

Hereinafter, the function of the memory chip 11 for automatically changing the set value of the read level and executing the retry read operation will be referred to as an auto-retry read (ARR) function. That is, the ARR function is applied to the test in the embodiment.

Figure 6:
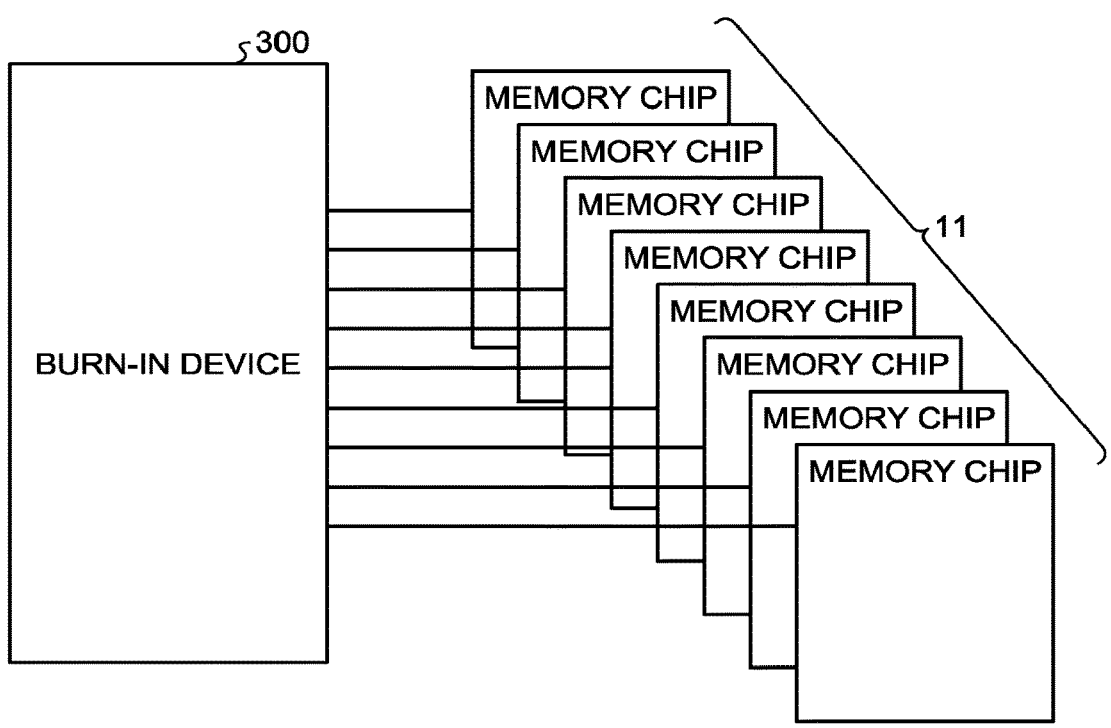
FIG. 6 is a schematic diagram illustrating an exemplary situation in a test of the memory chip in the embodiment.

FIG. 6 is a schematic diagram illustrating an exemplary situation of the memory chip 11 in the test in the embodiment. In the test, a large number of memory chips 11 are connected to a burn-in device 300 as illustrated in FIG. 6. The burn-in device 300 is an exemplary external device.

The burn-in device 300 is a test device which applies a load to the memory chips 11. The burn-in device 300 can transmit a command to each of the memory chips 11, but cannot accept or verify a response from each of the memory chips 11. By using the ARR function of the memory chip 11 of this embodiment, it is made possible for the test device, such as the burn-in device 300 incapable of accepting the response, to conduct a test.

The burn-in device 300 and the memory chips 11 are connected via a wiring group including an I/O signal line, a control signal line, and an R/B signal line. The burn-in device 300 can simultaneously transmit the same command to the respective memory chips 11 in parallel.

In the case of applying the ARR function, the register REG of the chip control circuit 113 stores a plurality of parameters that defines operations based on the ARR function.

Figure 7:
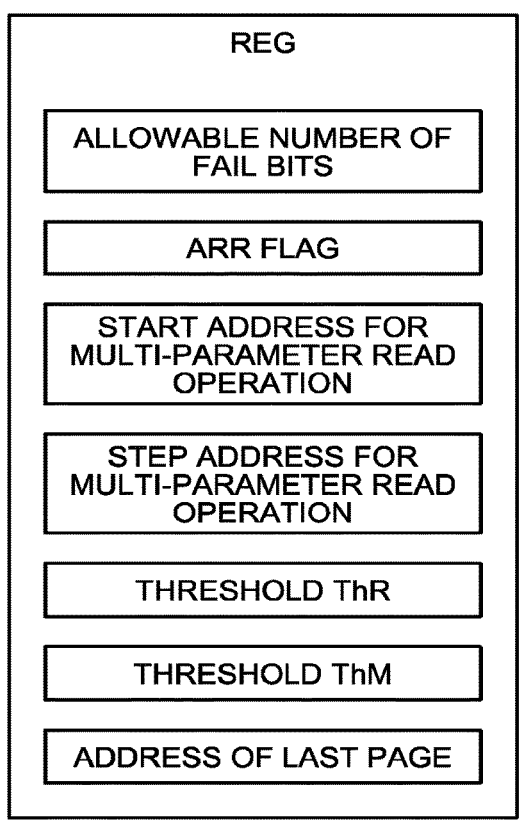
FIG. 7 is a schematic diagram illustrating exemplary various parameters stored in a register REG in the embodiment.

FIG. 7 is a schematic diagram illustrating exemplary various parameters stored in the register REG in the embodiment. As illustrated in FIG. 7, the register REG stores an allowable number of fail bits, an ARR flag, a start address for multi-parameter read operation, a step address for multi-parameter read operation, a threshold ThR, a threshold ThM, and an address of a last page. In the following, these parameters may be collectively referred to as an ARR parameter.

The allowable number of fail bits refers to a threshold to be compared with the number of fail bits in data read by read operation. Specifically, if the number of fail bits in the data read by the read operation exceeds the allowable number of fail bits, the memory chip 11 executes the retry read operation. Unless the number of fail bits of the data read by the read operation exceeds the allowable number of fail bits, the memory chip 11 does not execute the retry read operation.

The allowable number of fail bits is set, for example, in accordance with the fail-bit correctability of the ECC circuit 25 of the memory controller 2. As one example, the allowable number of fail bits can be set to an upper limit of the number of fail bits correctable by the ECC circuit 25 of the memory controller 2 or the number less than the upper limit. A setting method of the allowable number of fail bits is not limited to the above example.

The ARR flag represents flag information indicating whether to apply the ARR function.

The start address and the step address for multi-parameter read operation are parameters relating to storage locations of parameter sets necessary for the read operation.

Figure 8:
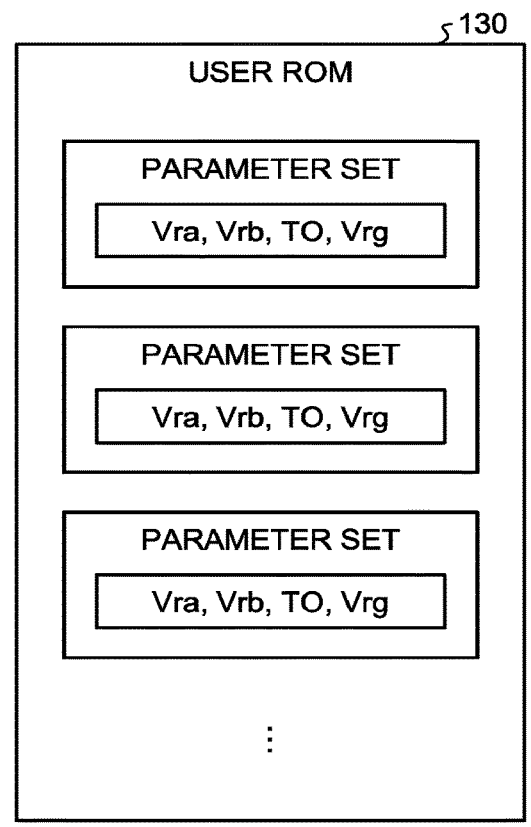
FIG. 8 is a schematic diagram illustrating a user ROM in which a plurality of sets of parameters is stored in the embodiment.

As illustrated in FIG. 8, two or more parameter sets are prepared in advance in a storage area, i.e., a user ROM 130. The user ROM 130 may be located in a given block BLK of the memory cell array 117 or may be formed of any memory of the memory chip 11. Each parameter set includes set values of the read levels Vra, Vrb, Vrc, Vrd, Vre, Vrf, and Vrg. That is, each parameter set includes set values of parameters for use in the read operation.

Each parameter set may include other parameters in addition to the read levels. For example, each parameter set may include a parameter that defines a length of time between an application of a read level and an execution of sensing, or may include a parameter relating to another operation such as program operation.

The multi-parameter read operation refers to reading one of the parameter sets from the user ROM 130 to collectively applying the set values of parameters of the read parameter set. A location of the multi-parameter set to use is designated by an address indicating a location in the user ROM 130. That is, the start address for multi-parameter read operation indicates a storage location of the set value for use in not a retry read operation but an initial read operation.

Upon execution of the retry read operation, the set values of the read levels are changed. The set values of the read levels are changed by switching the multi-parameter set for use to another set. In the embodiment, a parameter set stored subsequent to a parameter set used in the previous read operation including a retry read operation is used in the next retry read operation. The step address for multi-parameter read operation stored in the register REG represents an offset of an address, indicating a storage location of the parameter set used in the next retry read operation, from an address indicating the storage location of the parameter set used in the previous read operation including a retry read operation.

That is, the address of a storage location of the parameter set used in the next retry read operation can be found by adding the step address for multi-parameter read operation to the address of the storage location of the parameter set used in the previous read operation including a retry read operation.

The step address for multi-parameter read operation has a size of an integral multiple of the size of one parameter set. That is, the parameter sets stored in the user ROM 130 are usable in order of storage locations by setting the step address for multi-parameter read operation to the size of one parameter set. In addition, every certain number of parameter sets stored in the user ROM 130 are usable by setting the step address for multi-parameter read operation to a value twice or more of the size of one parameter set.

Upon receiving a command, the memory chip 11 can automatically test multiple pages sequentially without an additional command from outside in the embodiment. Specifically, the memory chip 11 sequentially sets multiple pages in a given area as a read target page in the order of address, to execute a read operation to the set target pages. The memory chip 11 can repeat the retry read operation until the data read from the target page satisfies the criterion defined by the allowable number of fail bits in terms of the number of fail bits. When the data read from the target page satisfies the criterion defined by the allowable number of fail bits in terms of the number of fail bits, the memory chip 11 sets the next page as a new target page.

Referring back to FIG. 7, the threshold ThR and the threshold ThM are defined for the number of retry read operations.

The threshold ThR corresponds to an upper limit of the number of retry read operations per page. The threshold ThM corresponds to an upper limit of the number of pages on which retry read operation is executed.

The address of the last page refers to an address indicating the last one of the pages to be tested. Herein, as an example, the address of the last page is denoted by an offset from the initial page of a block BLK, that is, a page number. A denotation of the address of the last page is not limited thereto.

Hereinafter, the memory chip 11's continuous read operations to multiple pages will be referred to as a test operation. The memory chip 11 starts a test operation in response to a command, and automatically ends the test operation when the last page is a test target page or when the number of executed retry read operations exceeds the criterion defined by the threshold ThR or the threshold ThM. At the time of ending the test operation, the memory chip 11 stores information on a pass or a fail of the test in the status register 116. The information on a pass or a fail of the test will be described later.

A fail bit is detected through comparison between data obtained by read operation and an expectation value of the data. The expectation value refers to data containing no fail bit.

Figure 9:
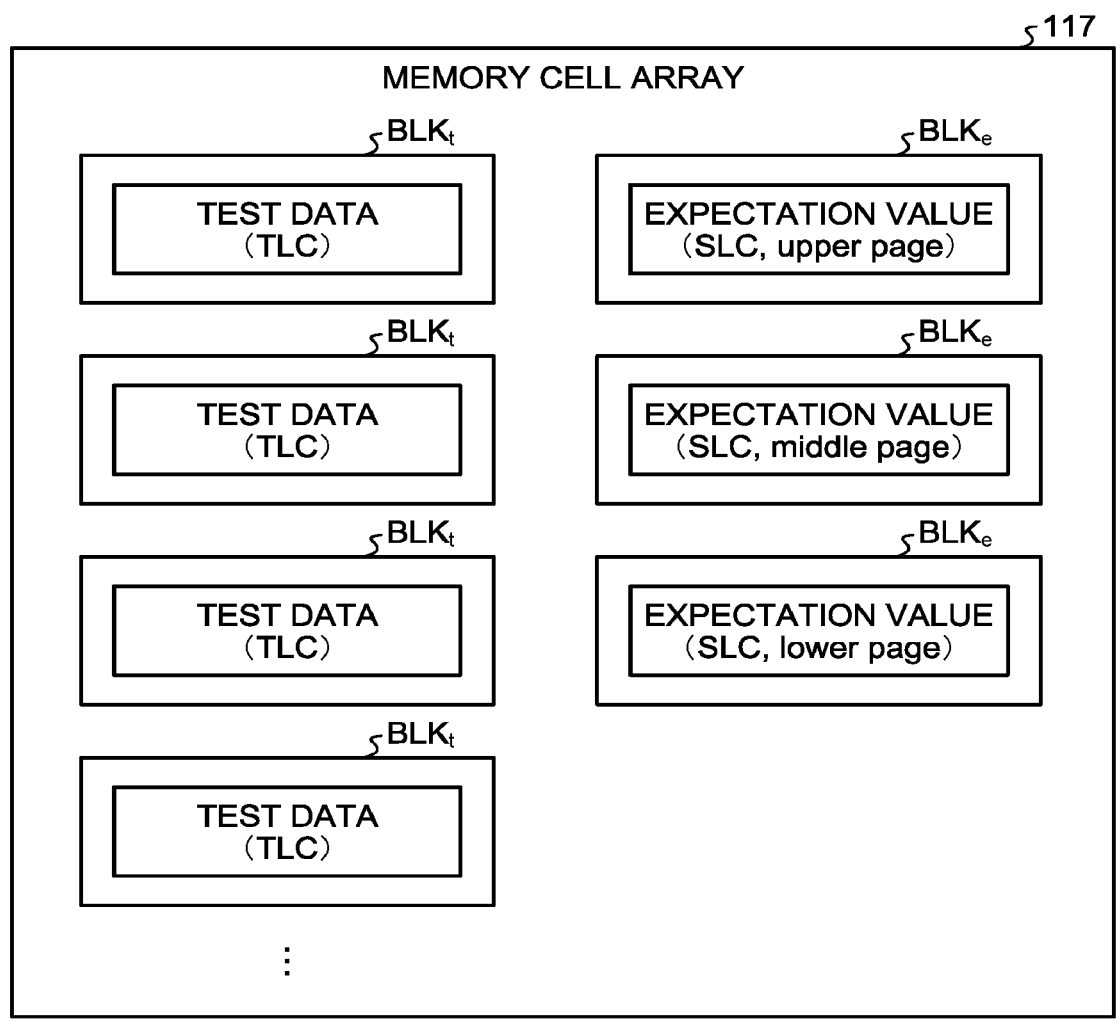
FIG. 9 is a schematic diagram of data stored in the memory cell array in the embodiment.

FIG. 9 is a schematic diagram of data stored in the memory cell array 117 in the embodiment. As illustrated in the drawing, test data is pre-stored in a TLC format in blocks BLKt settable as test targets among the blocks BLK of the memory cell array 117. That is, three pages of data are stored on each word line of each of the blocks BLKt. The blocks BLKt store the same data as test data.

The test data is stored in given three blocks of the blocks BLK of the memory cell array 117 by single-level cell (SLC) method. By SLC, 1-bit data is stored per memory cell.

Stored data by SLC is more reliable than by TLC. That is, the number of fail bits in data to read by SLC is smaller than by TLC. In the embodiment, the memory chip 11 regards the test data stored by SLC as data containing no fail bit, that is, the expectation value.

However, the test data is stored in the blocks BLKt by TLC. Thus, storing the same data as the test data by SLC requires a storage area of a size three times a size of a storage area by TLC. Thus, the test data as the expectation value is divided and stored into three blocks BLKe, as illustrated in FIG. 9. In the example of FIG. 9, of the test data, data written to an upper page, data written to a middle page, and data written to a lower page are stored in different blocks BLKe by SLC.

The expectation values can be stored in the blocks BLKe by any method other than SLC as long as the method is highly reliable. With almost no occurrence of fail bits, the expectation values may be stored in the blocks BLKe by multi-level cell (MLC) in which 2-bit data is stored per memory cell. In addition, the expectation values may be stored in advance in any storage of the memory chip 11 different from the memory cell array 117.

Next, a test method and an operation of the memory chip 11 in the test according to the embodiment will be described.

Figure 10:
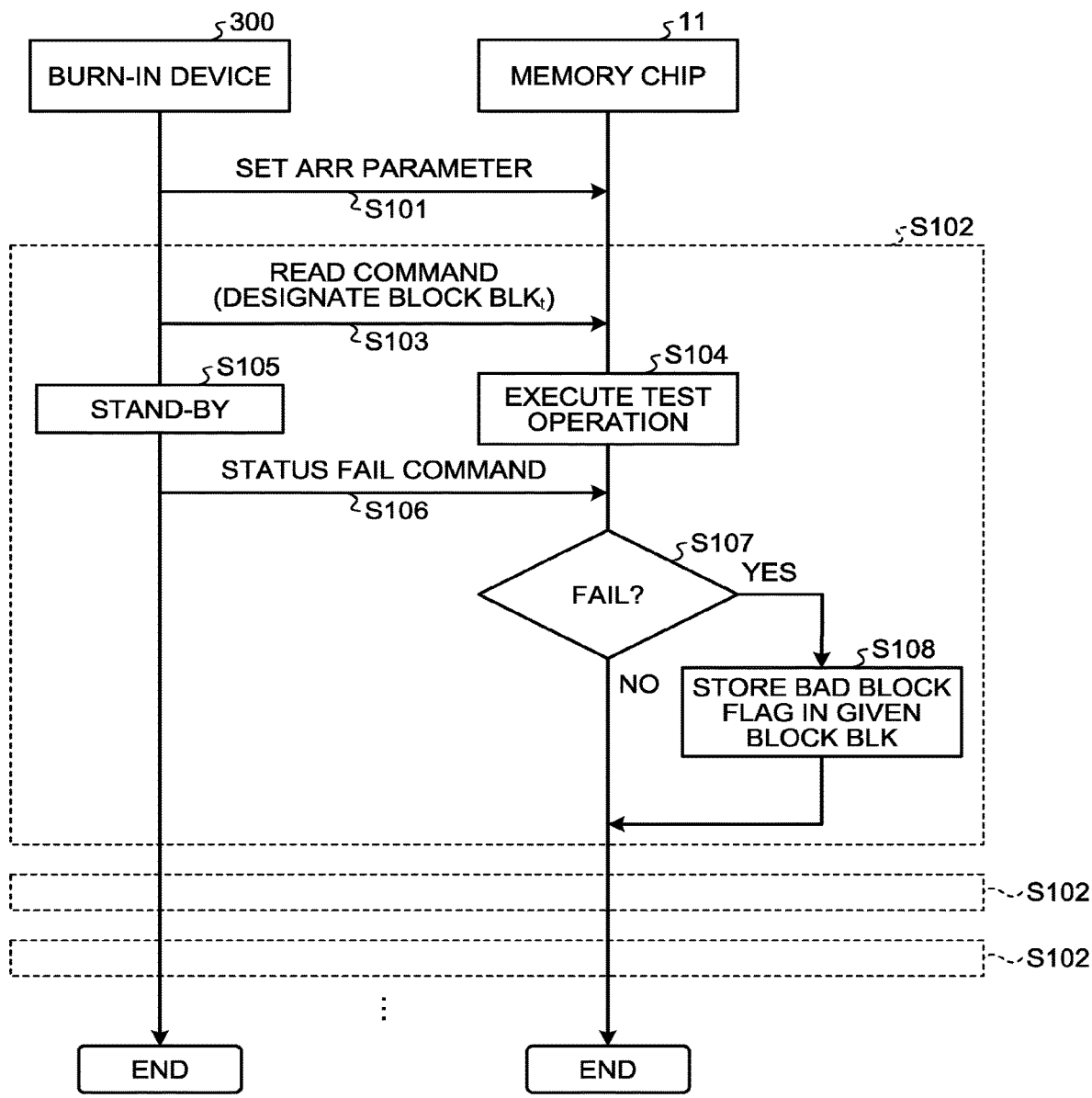
FIG. 10 is a sequence diagram for an exemplary test procedure of the memory chip in the embodiment.

FIG. 10 is a sequence diagram of an exemplary procedure of the test of the memory chip 11 in the embodiment.

FIG. 10 illustrates a relationship between the burn-in device 300 and one of the large number of memory chips 11 connected to the burn-in device 300 illustrated in FIG. 6. The burn-in device 300 can simultaneously transmit various commands illustrated in FIG. 10 in parallel to the other connected memory chips 11.

First, the burn-in device 300 sets the ARR parameter to the memory chip 11 (S101). The ARR parameter can be set, for example, by a set feature command. The ARR parameter is sent from the burn-in device 300 to the chip control circuit 113 via the I/O signal processing circuit 111 and the command register 114 in the memory chip 11. Then, the ARR parameter is stored in the register REG of the chip control circuit 113.

The ARR flag of the ARR parameter is set to a value representing the use of the ARR function. Because of this, in response to a read command from the burn-in device 300, the memory chip 11 can automatically execute the test operation according to the allowable number of fail bits, the start address for multi-parameter read operation, the step address for multi-parameter read operation, the threshold ThR, the threshold ThM, and the address of the last page.

Herein, an example of executing the test operation to each of the blocks BLKt of the memory chip 11 will be described.

A series of procedures of the test operation is repeated to one test target block BLKt, which will be referred to as a unit procedure. That is, the unit procedure (S102) can be executed to different test target blocks BLKt multiple times.

In each unit procedure, the burn-in device 300 first transmits a read command (S103). The read command includes an address indicating a test target block BLKt. That is, the test target block BLKt is designated by the read command.

After receiving the read command, the memory chip 11 starts the test operation (S104). Specifically, for example, the chip control circuit 113 refers to the ARR flag at the time of receiving the read command. The ARR flag is set to the value indicating the use of the ARR function in S101. Thus, the chip control circuit 113 interprets the read command sent in S103 as a command for starting the test operation, and starts the test operation.

If the ARR flag is not set to the value indicating the use of the ARR function, the chip control circuit 113 can execute a normal read operation in response to the read command.

Figure 11:
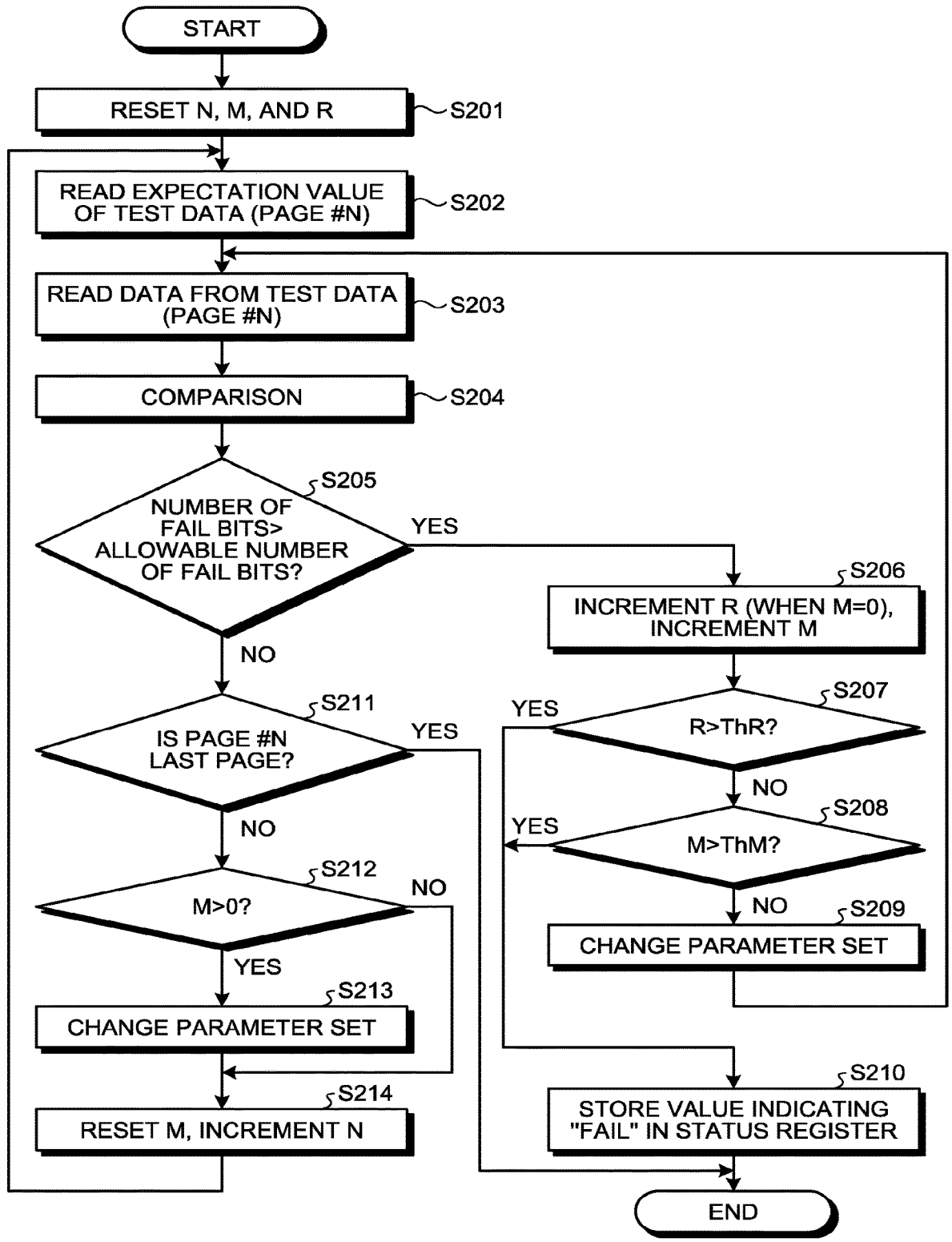
FIG. 11 is a flowchart of an exemplary procedure of a test to be conducted by the memory chip in the embodiment.

FIG. 11 is a flowchart of an exemplary series of procedures of the test operation to be executed by the memory chip 11 in the embodiment.

First, the chip control circuit 113 resets parameters N, M, and R for use in the test operation to zero (S201).

The parameter N represents an offset from the initial page of the block BLKt, and indicates a test target page, i.e., a read target page. That is, the parameter N is a page number indicating a test target page. When the parameter N is reset to zero, the initial page of the block BLKt is set as a test target page. The parameter N may be set to any value other than zero in S201. In the following, a page with the number N (page #N), that is, a test target page will be referred to as a target page.

The parameter M represents the number of retry read operations executed on a current target page. The parameter R represents the number of pages on which retry read operation has been executed since the start of the test operation.

Subsequently, the chip control circuit 113 controls the row decoder 120 and the sense amplifier 119 to read the expectation value corresponding to the test data stored in the target page (page #N) from the block BLKe (S202). The sense amplifier 119 stores the read expectation value in one of the six latch circuit groups of the data register 122a, the one for non-use in the read operation on the test data (that is, an operation in S203 to be described later). The latch circuit group to store the expectation value is not limited to a specific latch circuit group. Herein, as an example, the expectation value is stored in the latch circuit group CDL.

Then, the chip control circuit 113 controls the row decoder 120 and the sense amplifier 119 to read the test data from the target page (page #N) (S203). In the initial read operation to the target page, the parameter set stored at a location indicated by the start address for multi-parameter read operation is used.

In S203, the sense amplifier 119 determines the test data stored in the target page without using the latch circuit group CDL storing the expectation value. Then, the sense amplifier 119 stores the determined test data in, for example, the latch circuit group XDL.

Subsequently, the chip control circuit 113 compares the expectation value stored in the latch circuit group CDL and the test data stored in the latch circuit group XDL (S204). Specifically, for example, the chip control circuit 113 causes the computing unit 123 to execute a negative exclusive OR (XNOR) operation between the expectation value stored in the latch circuit group CDL and the test data stored in the latch circuit group XDL. As a result of the comparison, the same bits between the test data and the expectation value are set to "1" and different bits between the test data and the expectation value are set to "0". That is, "1" indicates a normal bit, and "0" indicates a fail bit. A method of the operation is not limited thereto. Instead of the negative exclusive OR (XNOR) operation, an exclusive OR (XOR) operation may be adopted.

The chip control circuit 113 determines whether the number of fail bits in the read test data exceeds the allowable number of fail bits (S205). The chip control circuit 113 determines whether the number of "0" in the comparison result is larger than the set allowable number of fail bits in the register REG.

After determining that the number of fail bits in the read test data exceeds the allowable number of fail bits (Yes in S205), the chip control circuit 113 increments the parameters R and M (S206). However, the chip control circuit 113 increments the parameter R if the parameter M before increment is zero.

Subsequently, the chip control circuit 113 determines whether the parameter R is larger than the threshold ThR (S207). In S207, the chip control circuit 113 determines whether the number of pages to which retry read operation has been executed since the start of the test operation has reached the threshold ThR.

When the parameter R is not larger than the threshold ThR (No in S207), that is, when the number of pages to which retry read operation has been executed since the start of the test operation has not reached the threshold ThR, the chip control circuit 113 determines whether the parameter M is larger than the threshold ThM (S208). In S208, the chip control circuit 113 determines whether the number of retry read operations executed on the current target page has reached the threshold ThM.

When the parameter M is not larger than the threshold ThM (No in S208), that is, when the number of retry read operations executed on the current target page has not reached the threshold ThM, the chip control circuit 113 changes the parameter set (S209). For example, the chip control circuit 113 adds the step address for multi-parameter read operation to an address of a storage location of the currently used parameter set, and loads a parameter set from the location indicated by the address obtained by the addition.

Subsequent to S209, the chip control circuit 113 re-executes the operation in S203. The chip control circuit 113 re-executes S203 after S209, implementing retry read operations, i.e., the second and subsequent read operations on the current target page.

The initial operations executed on the target page in S203 and S204 are an exemplary first operation. The initial operation executed on the target page in S204 is an exemplary third operation. The operation in S209 and the re-executed operations on the target page in S203 and S204 after S209 are an exemplary second operation. The re-executed operation to the target page in S204 after S209 is an exemplary fourth operation.

When the parameter R is larger than the threshold ThR (Yes in S207) or when the parameter M is larger than the threshold ThM (Yes in S208), the chip control circuit 113 stores, as fail information, a value indicating "fail" in the status register 116 (S210), and ends the test operation.

After determining that the number of fail bits in the read test data does not exceed the allowable number of fail bits (No in S205), the chip control circuit 113 determines whether the target page, that is, the page #N is the last page (S211). The chip control circuit 113 can determine whether the page #N is the last page, for example, by determining whether the parameter N is equal to the address of the last page stored in the register REG.

When the page #N is the last page (Yes in S211), the chip control circuit 113 ends the test operation.

When the page #N is not the last page (No in S211), the chip control circuit 113 determines whether the parameter M is larger than zero (S212). That is, the chip control circuit 113 determines whether the retry read operation has been executed on the current target page one or more times.

With the parameter M being larger than zero (Yes in S212), that is, with one or more retry read operations executed on the current target page, the currently used parameter set is different from the parameter set used in the initial read operation. Thus, the chip control circuit 113 changes the parameter set (S213). That is, the chip control circuit 113 loads a parameter set from a location indicated by the start address for multi-parameter read operation.

Subsequently, the chip control circuit 113 resets the parameter M to zero and increments the parameter N (S214) to re-execute the operation in S202. Thereby, the chip control circuit 113 sets the next page as a new target page to conduct a test of the new target page.

As described above, the chip control circuit 113 ends the test operation when the number of retry read operations executed on any page exceeds the threshold ThM, when the number of pages on which retry read operation has been executed exceeds the threshold ThR, or when the test of the entire page is completed. When the number of retry read operations executed on any page exceeds the threshold ThM or when the number of pages on which retry read operation has been executed exceeds the threshold ThR, the chip control circuit 113 stores the value indicating "fail" in the status register 116. Upon completion of the test of the entire page, the chip control circuit 113 does not store the value indicating "fail" in the status register 116.

Referring back to FIG. 10, during the test operation of the memory chip 11 (S104), the burn-in device 300 stands by (S105), that is, suspends the operation. The burn-in device 300 cannot accept a response from the memory chip 11, therefore, cannot recognize the end of the test operation (S104). In view of this, the burn-in device 300 suspends the operation until a given length of time elapses after the execution of S103. The suspension time is preset to a maximum time taken for the test operation.

After the stand-by, the burn-in device 300 transmits a status fail command to the memory chip 11 (S106). In the memory chip 11, the chip control circuit 113 determines whether the value indicating "fail" is stored in the status register 116 (S107), in response to the status fail command.

When the status register 116 stores the value indicating "fail" (Yes in S107), the chip control circuit 113 stores, in a given block BLK, a flag indicating that the test target block BLKt is a bad block (S108). The bad block refers to a block not of a desired quality level and set as non-use. That is, the bad block is set in accordance with a result of the test operation, i.e., pass or fail.

When the status register 116 stores no value indicating "fail" (No in S107) or after S108, the unit procedure (S102) ends.

Thereafter, the memory chip 11 executes the unit procedure (S102) multiple times while changing the test target block BLKt. Upon completion of the test of desired blocks BLKt, the burn-in device 300 ends the test for the memory chip 11.

The above embodiment has described the example of storing the value indicating "fail" in the status register 116 if the result of the determination on the operation to the test target block BLK is a fail. A value indicating "pass" may be stored in the status register 116 if the result of the determination on the operation to the test target block BLK is a pass.

After the test by the burn-in device 300, a device, such as a tester that verifies a response from the memory chip 11, may read, from the given block BLK, the flag (bad block flag) indicating that the test target block BLKt is a bad block. The tester sends a read command to the memory chip 11 to acquire the bad block flag from the memory chip 11, and records a block BLKt indicated by the bad block flag as a bad block in, for example, a ROM fuse (not illustrated) of the memory chip 11. Thereby, the block BLKt indicated by the bad block flag is set as a use-prohibited block BLK.

As described above, according to the embodiment the chip control circuit 113, the sense amplifier 119, and the row decoder 120 cooperatively constitute first circuitry that operates as follows. The first circuitry executes a first operation of reading data from a target page of the memory cell array 117 using a parameter (for example, a read level). The first operation is, for example, the initial operation including S203 and S204 on a target page. After the first operation, the first circuitry executes a second operation of changing a set value of the parameter to read the data. The second operation is, for example, the operation including S209 on the target page and the operation in S203 and S204 re-executed thereon after S209.

Such a configuration eliminates the necessity for the test device to verify individual items of data sent from the memory chip 11 or set the read level to each of the memory chips 11 on the basis of a result of data verification. This can simplify the test. In addition, an inexpensive test device which cannot verify a response from the memory chip is applicable.

The I/O signal processing circuit 111, the control signal processing circuit 112, and the RY/BY generation circuit 121 constitute second circuitry connectable to an external device. The burn-in device 300 corresponds to the external device. The first circuitry executes the first operation in response to a command from the external device (for example, the read command transmitted in S103), and executes the second operation after the first operation without an additional command from the external device.

With this configuration, the memory chip 11 can automatically execute the retry read operation after the read operation. Thus, the test can be simplified. An inexpensive test device which cannot verify a response from the memory chip is applicable.

The first operation further includes a third operation of comparing the expectation value of the data and the read data. The third operation is, for example, the initial operation on the target page in S204. The first circuitry determines whether to execute the second operation on the basis of a result of the third operation. The determination is, for example, the operation in S205.

With this configuration, the memory chip 11 can automatically determine whether to execute the retry read operation in accordance with the fail bit in the read data, without any assist from the external device. Thus, the test can be simplified. In addition, an inexpensive test device which cannot verify a response from the memory chip is applicable.

In response to a command from the external device (for example, the read command transmitted in S103), the first circuitry sets one of the pages as a target page and executes the first operation or both the first operation and the second operation on the page. Thereafter, the first circuitry sets a new page as a target page, and executes the first operation or both the first operation and the second operation on the page without an additional command from the external device.

With this configuration, the memory chip 11 can automatically conduct the test on the multiple pages without receiving a command for each page.

According to a technique for comparison with the embodiment, for example, to concurrently conduct a test on a large number of memory chips, the retry read operation is executed on one of the memory chips, and the progression of the test for the rest of the memory chips is interrupted until completion of the retry read operation, resulting in elongating the time taken for the test.

According to the embodiment, the multiple pages can be automatically tested without the input command for each page, so that during a retry read operation on a page of one memory chip 11, the test of the rest of the memory chips 11 can progress. This can prevent increase in the time taken for the test concurrently conducted on a large number of memory chips 11.

In addition, the first circuitry sequentially sets the multiple pages of a test target block BLK of the blocks BLK as a target page, counts a first number relating to the second operation, and determines a pass or a fail of the operation on the test target block BLK, on the basis of the first number. The first number is, for example, the parameter M or R used in the series of operations in FIG. 11. Counting the first number is, for example, the operations of S201, S206, and S214. The pass or fail determination on the operation to the test target block BLK is, for example, the operations of S207 or S208.

With this configuration, it is possible to extract, on a block basis, part of data requiring a large amount of time to read or difficult to read by the execution of the retry read operation.

In addition, the first circuitry stores a result of the pass or fail determination in the status register 116.

This enables, for example, the external device to acquire the result of the pass or fail determination as long as it can transmit a status read command for outputting the contents of the status register 116.

The storage location of the result of the pass or fail determination is not limited to the status register 116. The first circuitry may store the result of the pass or fail determination in a given block BLK of the memory cell array 117.

The first number refers to the number of executed second operations counted for each page. The first circuitry determines a pass or a fail by comparing between the first number and a threshold. In the example of FIG. 11, the parameter M corresponds to the first number. The operation of S208 corresponds to the comparison between the first number and the threshold.

With this configuration, for example, if there is a page from which it is difficult to read data of a certain level or more through a given number of retry read operations, a test result of the block BLK including the page can be determined as a fail.

Further, the first number is the number of pages on which the second operation has been executed, among the pages of the block BLK. The first circuitry determines a pass or a fail by comparing between the first number and a threshold. In the example of FIG. 11, the parameter R corresponds to the first number. The operation of S207 corresponds to the comparison between the first number and the threshold.

With this configuration, it is made possible to determine, as a fail, the test result of the block BLK including the given number of pages or more from which data is to be read through the retry read operation.

The parameters for the read operation include, for example, the read level. The parameters for the read operation may include other parameters in addition to the read level. For example, the parameters for the read operation may include time information that defines the length of time from the application of the read level to the execution of sensing.

The thresholds (ThM and ThR) to be compared with the first number can be set from the external device, for example, as in the operation of S101 in FIG. 10.

This can flexibly change the criteria for determining the test results of the blocks BLK.

The above embodiment has described the example of resetting the parameter R in each test operation. The chip control circuit 113 may accumulate the parameter R upon every test operation to each block BLKt, and store the accumulated value of the parameter R in a given storage area (for example, a given block BLK). In the case of the test resulting in a fail, the chip control circuit 113 may not add a value of the parameter R to the accumulated value while it may add a value of the parameter R to the accumulated value in the case of the test resulting in a pass.

The second operation includes a fourth operation identical to the third operation.

After the second operation, the first circuitry determines whether to re-execute the second operation based on a result of the fourth operation.

The memory cell array 117 includes the plurality of blocks BLK.

Each of the blocks BLK includes a plurality of pages.

The first circuitry sequentially sets the pages of one of the blocks BLK as a target page, counts the first number relating to the second operation, and determines, from the first number, a pass or a fail of the operation to the block BLK.

The memory cell array 117 includes the memory cell transistors MT having threshold voltages set in a plurality of states corresponding to data.

Reading the data is an operation for determining data by comparing the threshold voltages and a read level corresponding to a boundary between two adjacent states of the states.

The parameter includes the read level.

The threshold ThM can be set from the external device.

The threshold ThR can be set from the external device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory chip comprising:
a memory cell array; and
first circuitry that executes a first operation of reading data from a target area of the memory cell array using a parameter, and changes a set value of the parameter after the first operation to execute a second operation of reading the data, wherein the first operation includes a third operation of comparing an expectation value of the data with the read data, the first circuitry determines whether to execute the second operation from a result of the third operation, the memory chip further comprises second circuitry connectable to an external device, the memory cell array includes a plurality of first storage areas, the first circuitry is configured to:
- in response to a command from the external device, set one of the first storage areas as the target area to execute the first operation or the first operation and the second operation, and
- set another one of the first storage areas as the target area to execute the first operation or the first operation and the second operation without an additional command from the external device, the memory chip further comprises a second storage area, the memory cell array includes a plurality of third storage areas, the third storage areas each include the first storage areas, and the first circuitry is configured to:
- sequentially set the first storage areas of a fourth storage area as the target area,
- the fourth storage area being one of the third storage areas,
- count a first number relating to the second operation,
- determine a pass or a fail of an operation to the fourth storage area from the first number, and store a result of the determination on a pass or a fail in the second storage area.

2. The memory chip according to claim 1, wherein the second circuitry connectable to an external device, wherein the first circuitry executes the first operation in response to a command from the external device, and executes the second operation after the first operation without an additional command from the external device.

3. The memory chip according to claim 1, wherein the second operation includes a fourth operation identical to the third operation, the first circuitry determines after the second operation whether to re-execute the second operation, on the basis of a result of the fourth operation, the first number represents the number of executed second operations counted for each of the first storage areas, and the first circuitry determines a pass or a fail of the operation by comparing the first number and a threshold.

4. The memory chip according to claim 3, wherein the threshold is settable from the external device.

5. The memory chip according to claim 1, wherein the first number represents the number of first storage areas on which the second operation has been executed, among the first storage areas of the fourth storage area, and the first circuitry determines a pass or a fail of the operation by comparing the first number and a threshold.

6. The memory chip according to claim 5, wherein the first circuitry is configured to:
- store a second number,
- after determining the operation to the fourth storage area as a fail, refrain from adding the first number to the second number, and
- after determining the operation to the fourth storage area as a pass, add the first number to the second number.

7. The memory chip according to claim 5, wherein the threshold is settable from the external device.

8. The memory chip according to claim 1, wherein the memory cell array includes a plurality of memory cell transistors having threshold voltages set in a plurality of states corresponding to data, reading the data is an operation for determining the data by comparing the threshold voltages and a read level corresponding to a boundary between two adjacent states of the states, and the parameter includes the read level.

9. A memory chip comprising:

a memory cell array; and first circuitry that executes a first operation of reading data from a target area of the memory cell array using a parameter, and changes a set value of the parameter after the first operation to execute a second operation of reading the data, wherein the first operation includes a third operation of comparing an expectation value of the data with the read data, the first circuitry determines whether to execute the second operation from a result of the third operation, the second operation includes a fourth operation identical to the third operation, and the first circuitry determines after the second operation whether to re-execute the second operation on the basis of a result of the fourth operation.

10. A memory chip comprising:

a memory cell array; and first circuitry that executes a first operation of reading data from a target area of the memory cell array using a parameter, and changes a set value of the parameter after the first operation to execute a second operation of reading the data, wherein the first operation includes a third operation of comparing an expectation value of the data with the read data, the first circuitry determines whether to execute the second operation from a result of the third operation, the memory chip further comprises second circuitry connectable to an external device, the memory cell array includes a plurality of first storage areas, the first circuitry is configured to:
- in response to a command from the external device, set one of the first storage areas as the target area to execute the first operation or the first operation and the second operation, and
- set another one of the first storage areas as the target area to execute the first operation or the first operation and the second operation without an additional command from the external device, the memory cell array includes a plurality of second storage areas, the second storage areas each include the first storage areas, and the first circuitry is configured to:
- sequentially set the first storage areas of a third storage area as the target area, the third storage area being one of the second storage areas,
- count a first number relating to the second operation, and determine a pass or a fail of an operation to the third storage area from the first number.

\* \* \* \* \*